United States Patent
Liu et al.

(10) Patent No.: US 12,217,825 B2
(45) Date of Patent: Feb. 4, 2025

(54) DRIVE CIRCUIT AND MEMORY DEVICE

(71) Applicant: ChangXin Memory Technologies, Inc., Hefei (CN)

(72) Inventors: Zhonglai Liu, Hefei (CN); Xianjun Wu, Hefei (CN); Anping Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 18/180,038

(22) Filed: Mar. 7, 2023

(65) Prior Publication Data

US 2024/0079038 A1    Mar. 7, 2024

(30) Foreign Application Priority Data

Sep. 5, 2022 (CN) .......................... 202211080191.8

(51) Int. Cl.
*G11C 5/02* (2006.01)
*G11C 8/08* (2006.01)
*H03K 3/037* (2006.01)

(52) U.S. Cl.
CPC .............. *G11C 8/08* (2013.01); *H03K 3/037* (2013.01); *G11C 5/025* (2013.01)

(58) Field of Classification Search
None
See application file for complete search history.

(56) References Cited

U.S. PATENT DOCUMENTS

| 10,978,138 B2 | 4/2021 | Kim et al. |
| 11,176,987 B2 | 11/2021 | Kawamura et al. |
| 2019/0252005 A1* | 8/2019 | Kim ........................ G11C 5/025 |

OTHER PUBLICATIONS

EP3912163A4 Supplementary European Search Report mailed Mar. 16, 2022.

* cited by examiner

*Primary Examiner* — Jason Lappas
(74) *Attorney, Agent, or Firm* — Syncoda LLC; Feng Ma (57) ABSTRACT

The disclosed driver and memory include: a phase driver that receives a first voltage signal, configured to output a second phase signal according to the first phase signal and the first voltage signal; a complementary phase driver includes: a first inverter for generating a complementary inverted phase signal based on a first complementary phase signal, the first phase signal and the first complementary phase signal are mutually inverted; a second inverter for receiving an output signal of the first inverter and a second voltage signal, the voltage value of the second voltage signal is smaller than that of the first voltage signal, and the second inverter is configured to be based on the first complementary inverted phase signal, and the second voltage signal outputs a second complementary phase signal. The driver of the embodiment provides the second phase signal and the second complementary phase signal.

13 Claims, 8 Drawing Sheets

DRIVE CIRCUIT AND MEMORY DEVICE

TECHNICAL FIELD

The present disclosure relates to the technical field of integrated circuits, and in particular, to a driver and a memory.

BACKGROUND

In a high density memory, the array of memory cells is divided into blocks of memory cells. Each block of memory cell may include local word lines, requiring drivers for the local word lines. Global word line drivers drive global word line groups for columns of blocks in the array. Each word line in the global set of word lines is set according to the operations applied to the selected block (e.g., read, program, and erase of high density devices). The word line driver may include pass transistors for transferring voltages from global word lines to local word lines. Therefore, there is a need to provide a driver capable of generating local word line signals for local word lines.

It should be noted that the information disclosed in the above background section is only for enhancement of understanding of the background of the present disclosure, and therefore may contain information that does not form the prior art that is already known to a person of ordinary skill in the art.

SUMMARY

An embodiment of the present disclosure provides a driver, including: a phase driver, wherein the phase driver receives a first voltage signal, and the phase driver is configured to output a second phase signal according to the first phase signal and the first voltage signal.

A complementary phase driver comprising: a first inverter, configured to generate a complementary inverted phase signal based on a first complementary phase signal, where the first phase signal and the first complementary phase signal are mutually inverted signals.

The second inverter receives the output signal of the first inverter and a second voltage signal, the voltage value of the second voltage signal is smaller than the voltage value of the first voltage signal, and the second inverter uses and outputting a second complementary phase signal based on the first complementary inverted phase signal and the second voltage signal.

An embodiment of the present disclosure provides a memory, including: the driver according to any embodiment of the present disclosure; and a storage cell array.

Some embodiments of the present disclosure provide a driver including a phase driver and a complementary phase driver, the phase driver receiving a first voltage signal, the complementary phase driver including a first inverter and a second inverter, the second inverter receives the second voltage signal, and the voltage value of the second voltage signal is smaller than the voltage value of the first voltage signal, thereby providing a driver with a simple structure and capable of satisfying driving requirements.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative effort.

DETAILED DESCRIPTION OF THE PREFERRED EMBODIMENTS

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of the embodiments of the present disclosure. However, those skilled in the art will appreciate that the technical solutions of the present disclosure may be practiced without one or more of the specific details, or other methods, components, devices, steps, etc. may be employed. In other instances, well-known solutions have not been shown or described in detail to avoid obscuring aspects of the present disclosure.

In addition, the drawings are merely schematic illustrations of the present disclosure, and the same reference numerals in the drawings denote the same or similar parts, and thus their repeated descriptions will be omitted. Some of the block diagrams shown in the figures are functional entities that do not necessarily correspond to physically or logically separate entities. These functional entities may be implemented in software, or in one or more hardware modules or integrated circuits, or in different networks and/or processor devices and/or microcontroller devices.

The exemplary embodiments of the present disclosure will be described in detail below with reference to the accompanying drawings.

Figure 1:
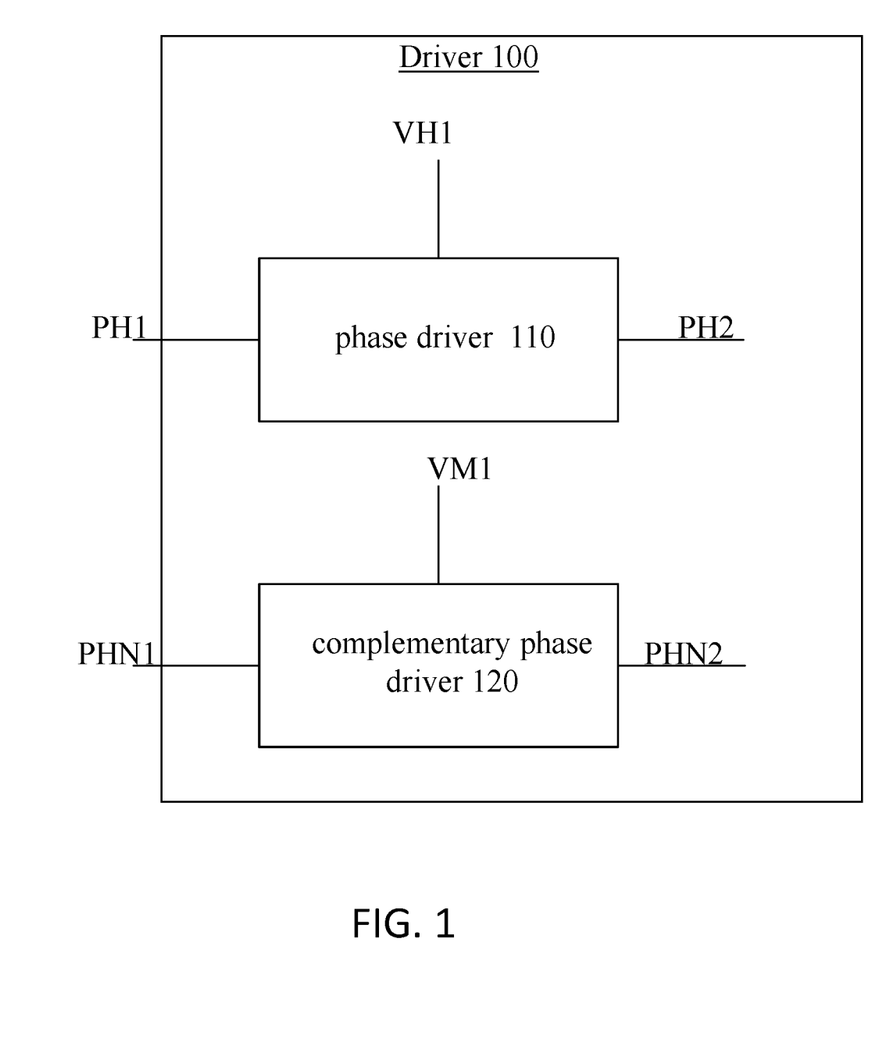
FIG. 1 is a schematic diagram of a driver according to an exemplary embodiment of the present disclosure.

FIG. 1 is a schematic diagram of a driver in an exemplary embodiment of the present disclosure.

As shown in FIG. 1, the driver 100 provided by the embodiment of the present disclosure may include a phase driver 110 and a complementary phase driver 120.

The phase driver 110 may include two input pins and one output pin, an input pin of the phase driver 110 may be connected to a first power terminal, and the first power terminal may provide the phase driver 110 with a first voltage signal VH1. Another input pin of the phase driver 110 may receive the first phase signal PH1. The phase driver 110 may be configured to generate the second phase signal PH2 according to the received first phase signal PH1 and the first voltage signal VH1 provided by the first power supply terminal. The output pin of the phase driver 110 may be used to output the generated second phase signal PH2.

The complementary phase driver 120 may also include two input pins and one output pin, one input pin of the complementary phase driver 120 may be connected to a second power supply terminal, and the second power supply terminal may provide the complementary phase driver 120 with a second voltage signal VM1. Another input pin of the complementary phase driver 120 may receive the first complementary phase signal PHN1. The complementary phase driver 120 may be configured to generate the second complementary phase signal PHN2 according to the received first complementary phase signal PHN1 and the second voltage signal VM1 provided by the second power terminal. The output pin of the complementary phase driver 120 may be used to output the generated second complementary phase signal PHN2.

It should be understood that the "pin" described in the embodiments of the present disclosure only represents the connection terminal between the device and the external structure of the device, and is not limited to the connection terminal having a fixed shape and structure, nor is it limited to the device must be discrete device. The "power terminal" described in the embodiments of the present disclosure only represents the nature and purpose of the connection port, and is not limited to the fact that it must be directly connected to the power pad.

In the embodiment of the present disclosure, the first phase signal PH1 and the first complementary phase signal PHN1 may be mutually inverse signals, that is, at the same time, if the first phase signal PH1 is in a first level state (e.g., a high level or a low level) level), the first complementary phase signal PHN1 is in the second level state (e.g., low level or high level).

In the embodiment of the present disclosure, the second phase signal PH2 and the second complementary phase signal PHN2 may be mutually inverse signals, that is, at the same time, if the second phase signal PH2 is in the first level state (for example, a high level or a low level) level), the second complementary phase signal PHN2 is in the second level state (e.g., low level or high level).

In the embodiment of the present disclosure, the second phase signal PH2 output by the phase driver 110 and the second complementary phase signal PHN2 output by the complementary phase driver 120 may be provided to the local word line driver as the driving of the local word line driver to satisfy the local word line drive requirements for the driver.

Figure 2:
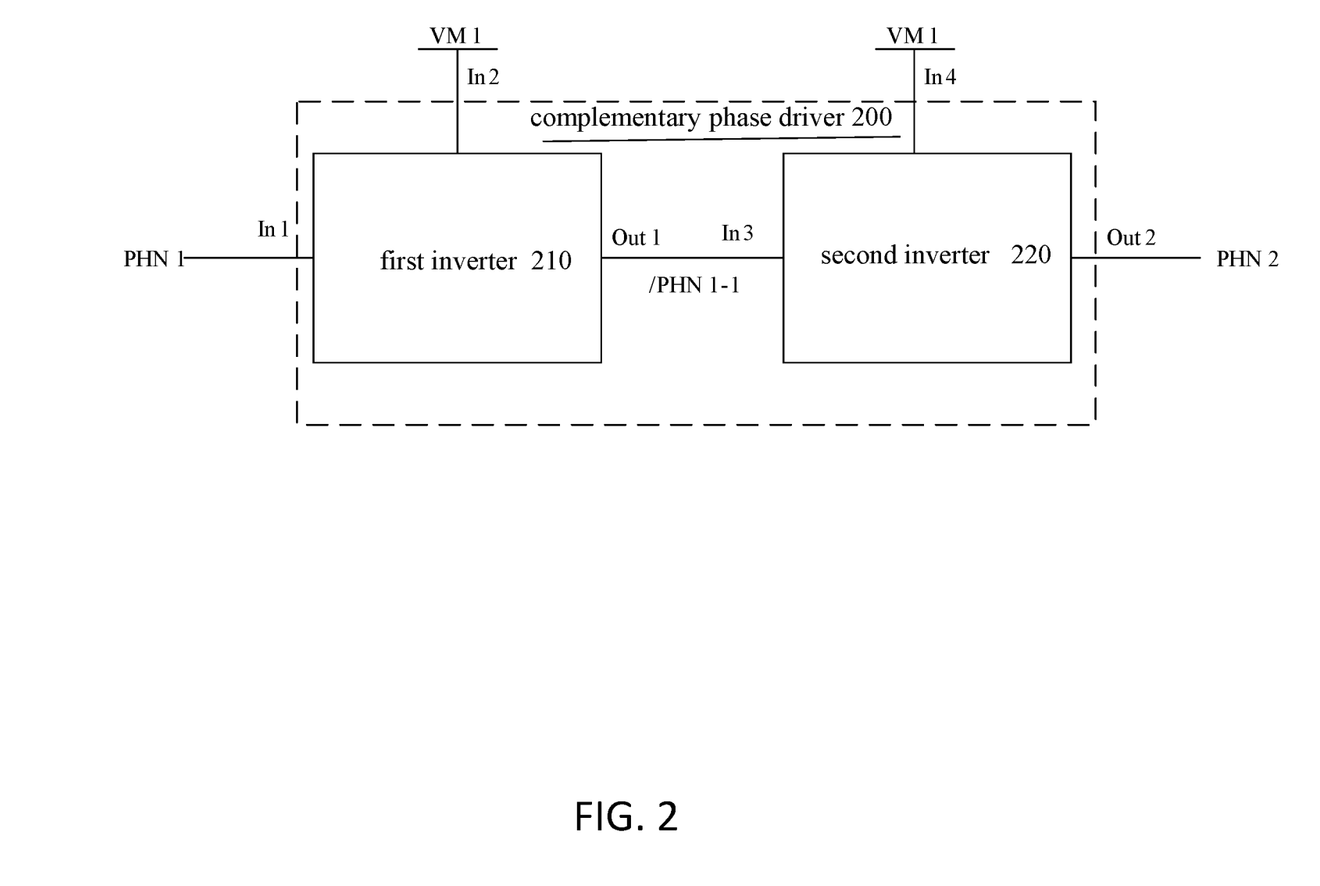
FIG. 2 is a schematic diagram of a complementary phase driver according to an exemplary embodiment of the present disclosure.
Figure 3:
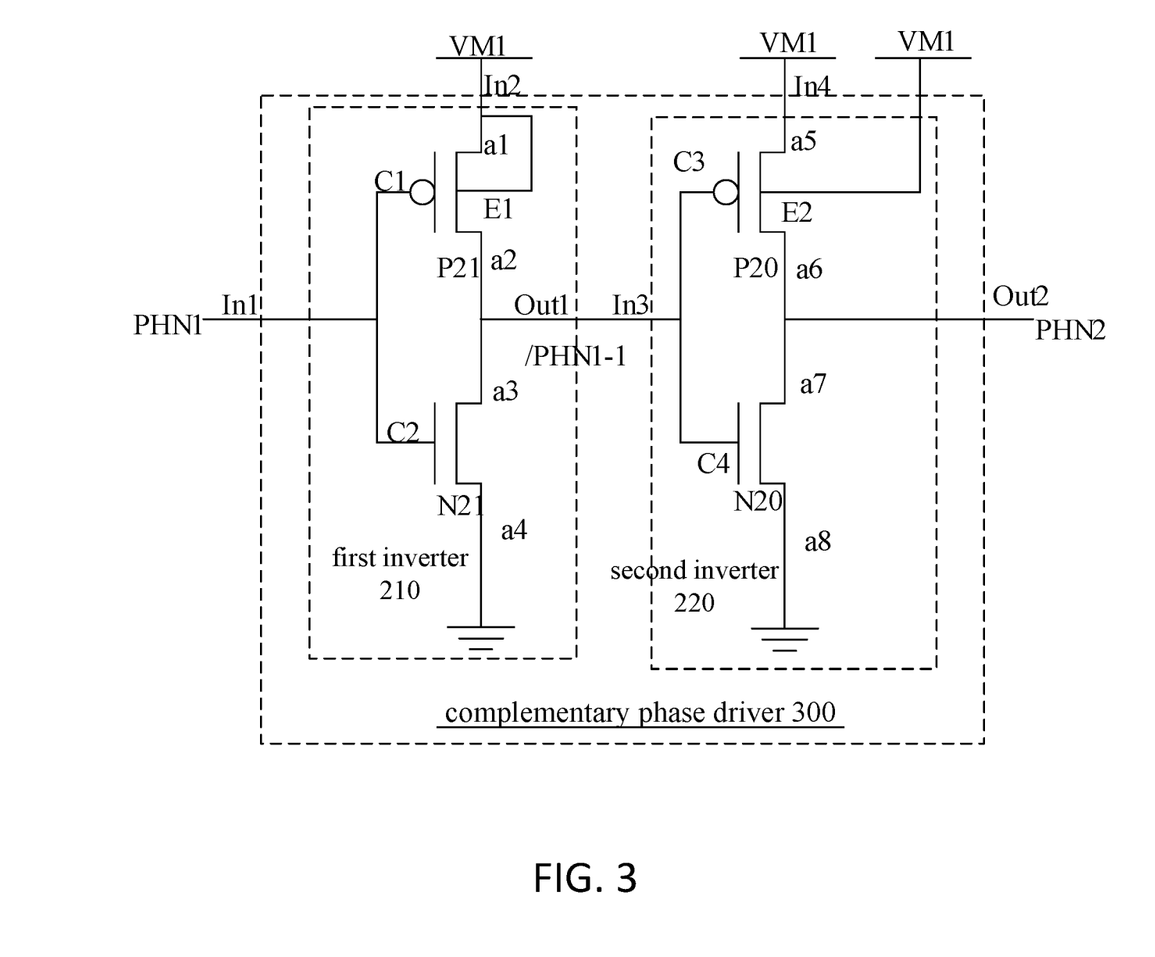
FIG. 3 is a schematic diagram of a complementary phase driver according to another exemplary embodiment of the present disclosure.
Figure 6:
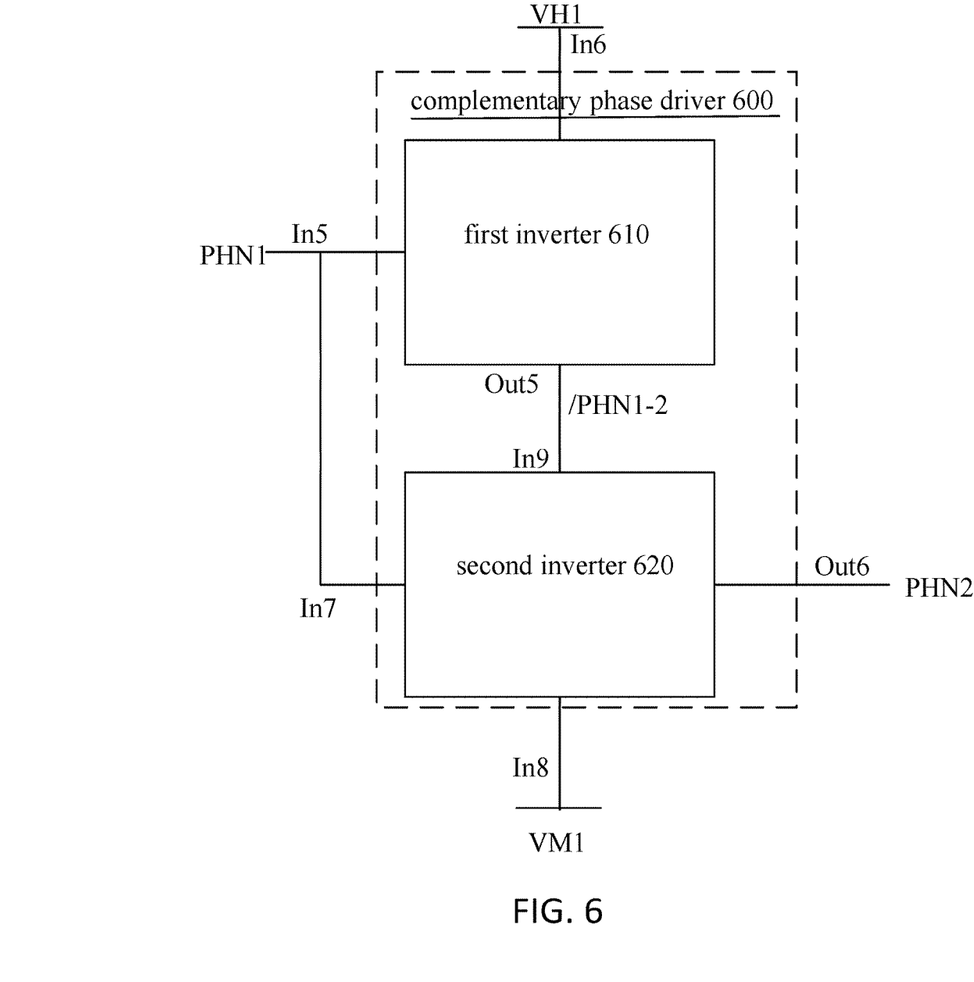
FIG. 6 is a schematic diagram of a complementary phase driver according to yet another exemplary embodiment of the present disclosure.
Figure 7:
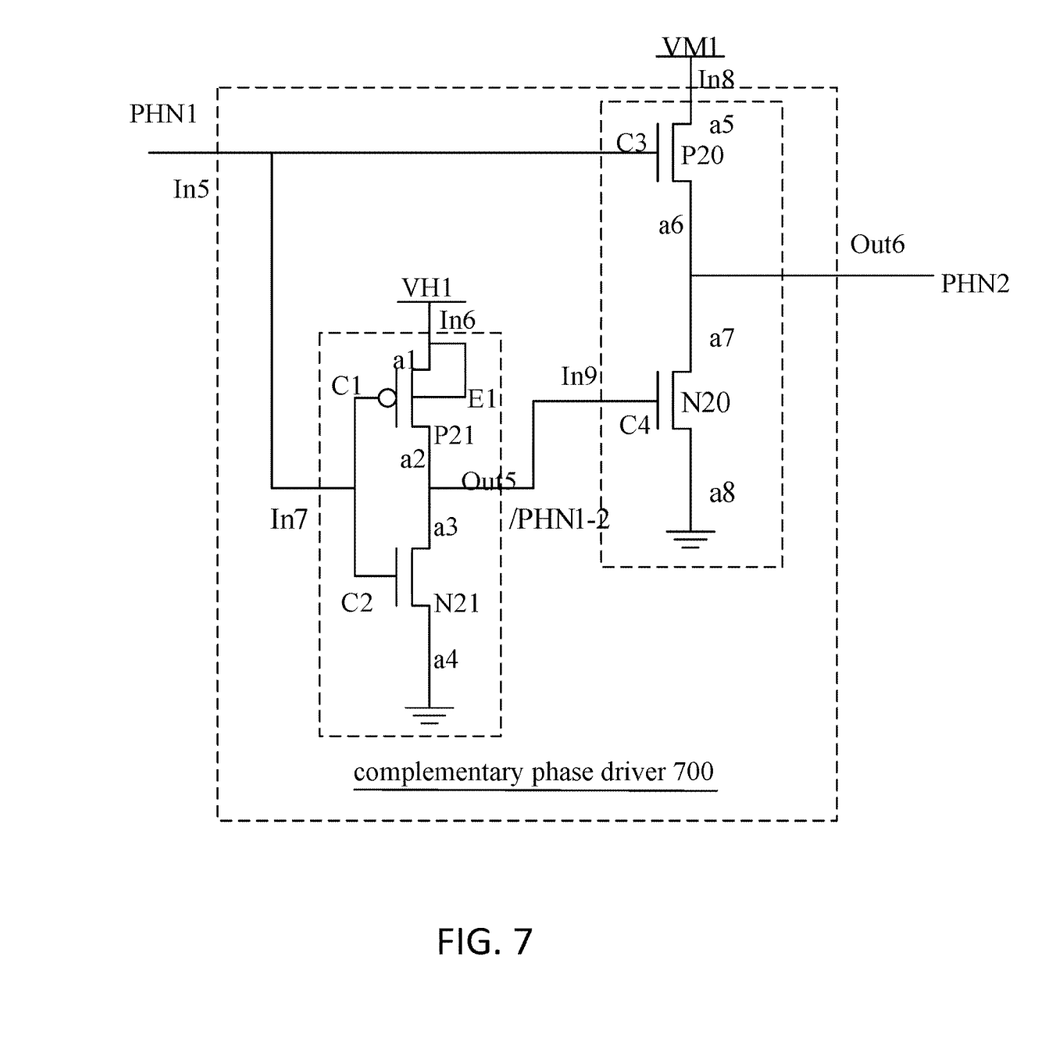
FIG. 7 is a schematic diagram of a complementary phase driver according to yet another exemplary embodiment of the present disclosure.

For the complementary phase driver 120 in the embodiment of the present disclosure, reference may be made to the complementary phase driver 200 provided by the embodiment of FIG. 2, the complementary phase driver 300 provided by the embodiment of FIG. 3, the complementary phase driver 600 provided by the embodiment of FIG. 6 and the embodiment of FIG. 7 The complementary phase driver 700 is provided by way of example, but the present disclosure is not limited thereto.

FIG. 2 is a schematic diagram of a complementary phase driver in an exemplary embodiment of the present disclosure.

As shown in FIG. 2, the complementary phase driver 200 provided by the embodiment of the present disclosure may include a first inverter 210 and a second inverter 220.

The first inverter 210 may include a first input terminal In1, a second input terminal In2 and a first output terminal Out1, the first input terminal In1 may be used to receive a first complementary phase signal PHN1, the second input terminal In1. The input terminal In2 can be used to connect to the first power terminal for receiving the second voltage signal VM1 provided by the second power terminal, and the first inverter 210 can be used to be based on the first complementary phase signal PHN1 and the second voltage signal VM1 generates a first complementary inverted phase signal /PHN1-1, and the first output terminal Out1 can be used to output the first complementary inverted phase signal /PHN1-1. In the embodiment of the present disclosure, the complementary phase inverted signal /PHN1 may include a first complementary phase inverted signal /PHN1-1.

The second inverter 220 may include a third input terminal In3, a fourth input terminal In4 and a second output terminal Out2, the third input terminal In3 may be connected to the first output terminal Out1, and may be used to receive the first output terminal Out1. A complementary inverted phase signal /PHN1-1, the fourth input terminal In4 can be used to receive the second voltage signal VM1, the second inverter 120 can be used to invert the phase based on the first complementary The signal /PHN1-1 and the second voltage signal VM1 generate a second complementary phase signal PHN2, and the second output terminal Out2 may be used to output the second complementary phase signal PHN2.

In an exemplary embodiment, the voltage value of the second voltage signal VM1 may be between 1V and 2V. The second voltage signal VM1 is a middle voltage, which is called a middle voltage. Compared with the first voltage signal VH1 mentioned in the following embodiments, VH1 is a high voltage. That is, the second voltage signal VM1 is smaller than the voltage value of the first voltage signal VH1, but higher than the voltage value of the low potential (e.g., ground or negative voltage). For example, when the voltage value of the first voltage signal VH1 is about 3V, the voltage value of the second voltage signal VM1 is about 1.5V. However, the present disclosure is not limited to this, as long as the driving of the transistors in the first inverter 110 and the second inverter 120 can be met.

A driver provided by an embodiment of the present disclosure includes a phase driver and a complementary phase driver, the phase driver is connected to a first power supply terminal, the complementary phase driver includes a first inverter and a second inverter, and the second inverter The second power supply terminal is connected, and the voltage value provided by the second power supply terminal is smaller than the voltage value provided by the above-mentioned first power supply terminal, thereby providing a driver with a simple structure and capable of meeting driving requirements.

FIG. 3 is a schematic diagram of a complementary phase driver in another exemplary embodiment of the present disclosure.

As shown in FIG. 3, the first inverter 210 in the complementary phase driver 200 provided by the embodiment of the present disclosure may include: a first transistor P21 of a first type and a second transistor N21 of a second type.

The first transistor P21 of the first type may include a first terminal a1 and a substrate E1, and both the first terminal a1 and the substrate E1 of the first transistor P21 may be connected to the second input terminal In2, that is, the first terminal a1 of the first transistor P21 and the substrate E1 are both connected to the second power terminal to receive the second voltage signal VM1 provided by the second power terminal. The second transistor N21 of the second type may be connected to the first transistor P21 of the first type.

Continuing to refer to FIG. 3, the first transistor P21 of the first type may further include a control terminal C1 and a second terminal a2, the control terminal C1 of the first transistor P21 may be connected to the first input terminal In1, and may be used to receive the first input terminal In1. A complementary phase signal PHN1.

The second transistor N21 of the second type may include a control terminal C2, a first terminal a3 and a second terminal a4. The control terminal C2 of the second transistor N21 may be connected to the first input terminal In1, and may be used to receive the first input terminal In1. For the complementary phase signal PHN1, the first terminal a3 of the second transistor N21 can be connected to the second terminal a2 of the first transistor P21, and the second terminal a4 of the second transistor N21 can be connected to a low potential.

Both the second terminal a2 of the first transistor P21 and the first terminal a3 of the second transistor N21 may be connected to the first output terminal Out1 of the first inverter, and the first output terminal Out1 may be used to output the first complementary inverted phase signal /PHN1-1.

In an exemplary embodiment, the first transistor P21 of the first type may be a PMOS (Positive Channel Metal Oxide Semiconductor, P-channel metal oxide semiconductor field effect) transistor, and the second transistor N21 of the second type may be an NMOS (Negative Channel Metal Oxide Semiconductor) transistor. Channel Metal Oxide Semiconductor, N-channel metal oxide semiconductor field effect transistor, but the present disclosure is not limited thereto.

When the first transistor P21 of the first type is a PMOS transistor, the first terminal a1 may be the source of the PMOS transistor, the control terminal C1 may be the gate of the PMOS transistor, and the second terminal a2 may be the drain of the PMOS transistor.

When the second transistor N21 of the second type is an NMOS transistor, the first terminal a3 may be the source of the NMOS transistor, the control terminal C2 may be the gate of the NMOS transistor, and the second terminal a4 may be the drain of the NMOS transistor.

In the complementary phase driver provided by the embodiment of the present disclosure, the source and the substrate of the first transistor P21 in the first inverter in the complementary phase driver are both connected to the second power supply terminal, and both receive the same second voltage signal VM1, even if the bulk voltage of the first transistor P21 (i.e., the bulk voltage of the substrate) becomes the second voltage signal VM1, so that there is no voltage difference between the bulk voltage and the source voltage of the first transistor P21, by doing this we can avoid the problem of PN junction leakage from the bulk voltage of the first transistor P21 to the source voltage.

Continuing to refer to FIG. 3, the second inverter 220 in the complementary phase driver 300 provided by the embodiment of the present disclosure may include: a third transistor P20 of a first type and a fourth transistor N20 of a second type.

The third transistor P20 of the first type may include a first terminal a5 and a substrate E2, and both the first terminal a5 and the substrate E2 of the third transistor P20 may be connected to the second power terminal for receiving the second power supply terminal. The second voltage signal VM1 provided by the two power terminals. The first terminal a5 of the third transistor P20 may be connected to the fourth input terminal In4 of the second inverter. The fourth transistor N20 of the second type may be connected to the third transistor P20 of the first type.

In the embodiment of FIG. 3, the third transistor P20 of the first type may further include a control terminal C3, a substrate E2 and a second terminal a6, and the control terminal C3 of the third transistor P20 may be connected to the third input terminal In3, which may be for receiving the first complementary phase inverted signal /PHN1-1.

The second type fourth transistor N20 may include a control terminal C4, a first terminal a7 and a second terminal a8, and the control terminal C4 of the fourth transistor N20 may be connected to the third input terminal In3, and may be used to receive the first terminal Complementary inverted phase signal /PHN1-1, the first terminal a7 of the fourth transistor N20 and the second terminal a6 of the third transistor P20 can both be connected to the second output terminal Out2, and the second terminal a8 of the fourth transistor N20 can be Connect to low potential.

It should be noted that, the low potential in the embodiments of the present disclosure may be ground or a negative voltage, which is not limited in the present disclosure.

In an exemplary embodiment, the first type third transistor P20 may be a PMOS transistor, and the second type fourth transistor N20 may be an NMOS transistor, but the present disclosure is not limited thereto.

When the third transistor P20 of the first type is a PMOS transistor, the first terminal a5 of the third transistor P20 may be the source of the PMOS transistor, the control terminal C3 of the third transistor P20 may be the gate of the PMOS transistor, and the third transistor The second terminal a6 of P20 may be the drain of the PMOS transistor.

When the fourth transistor N20 of the second type is an NMOS transistor, the first terminal a7 of the fourth transistor N20 may be the source of the NMOS transistor, the control terminal C4 of the fourth transistor N20 may be the gate of the NMOS transistor, and the fourth transistor N20 may be the gate of the NMOS transistor. The second terminal a8 of N20 may be the drain of the NMOS transistor.

In the complementary phase driver provided by the embodiment of the present disclosure, the source and the substrate of the third transistor P20 in the second inverter in the complementary phase driver are both connected to the second power supply terminal, and both receive the same second voltage signal VM1, even the bulk voltage of the third transistor P20 (i.e., the bulk voltage of the substrate) becomes the second voltage signal VM1, so that there is no voltage difference between the bulk voltage and the source voltage of the third transistor P20, by This can avoid the problem of PN junction leakage from the bulk voltage of the third transistor P20 to the source voltage.

Figure 4:
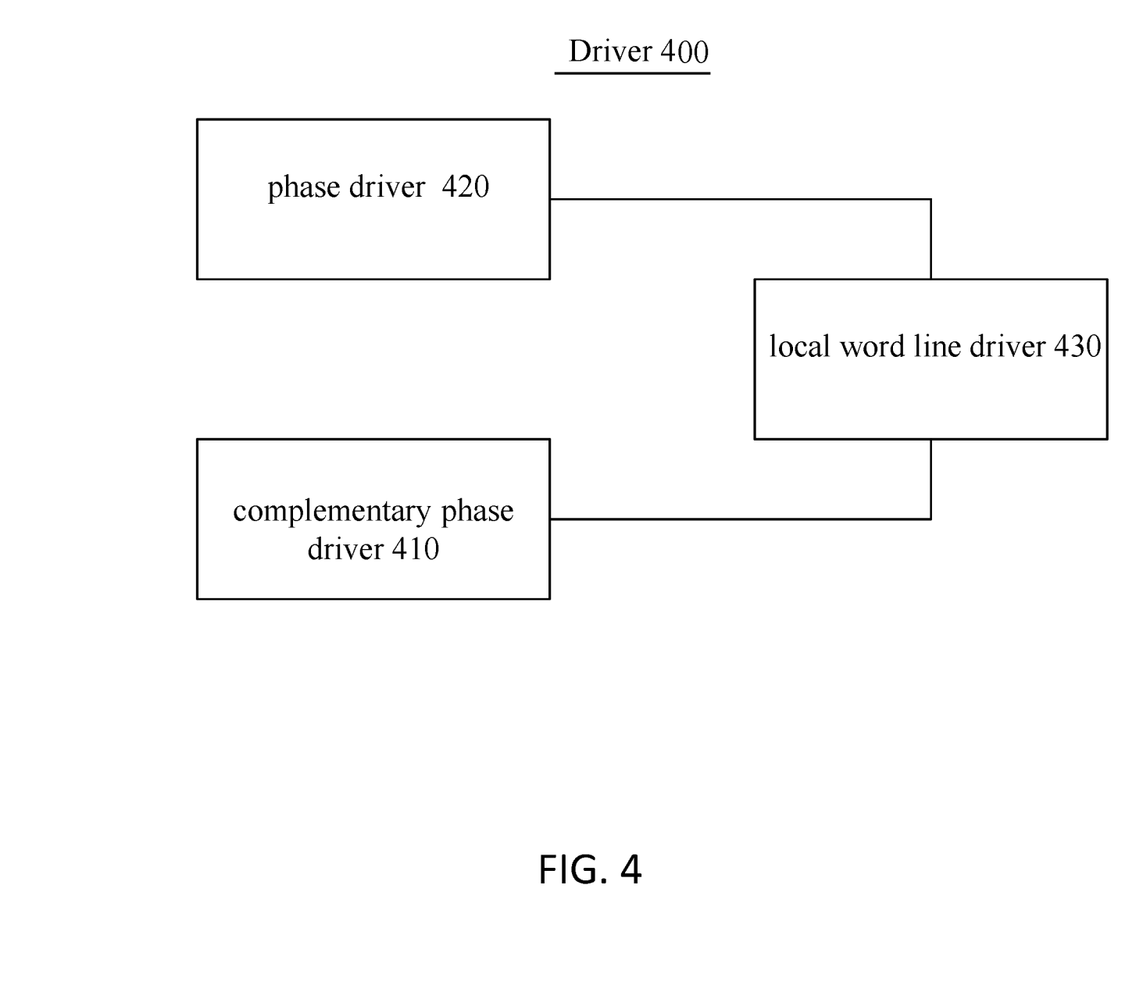
FIG. 4 is a schematic diagram of a driver according to another exemplary embodiment of the present disclosure.

FIG. 4 is a schematic diagram of a driver in an exemplary embodiment of the present disclosure.

As shown in FIG. 4, the driver 400 provided by the embodiment of the present disclosure may include: a complementary phase driver 410, a phase driver 420 and a local word line driver 430.

The complementary phase driver 410 may adopt the complementary phase driver provided by any embodiment of the present disclosure, for example, the complementary phase driver 200 provided by the above embodiment shown in FIG. 2, or the complementary phase driver 300 provided by the above embodiment shown in FIG. 3. The complementary phase driver 600 provided in the embodiment in FIG. 6 is described above, or the complementary phase driver 700 provided in the embodiment in FIG. 7 described below.

The local word line driver 430 may be connected to the complementary phase driver 410 and the phase driver 420, respectively. The local word line driver 430 can receive the second complementary phase signal PHN2 output by the phase driver 420 and the second phase signal PH2 output by the phase driver 410, respectively, and the local word line driver 430 can be used for according to the second phase signal PH2 and the second complementary phase signal PHN2 generates a local word line signal.

The driver provided by the embodiment of the present disclosure includes a phase driver, a complementary phase driver and a local word line driver, the phase driver can provide a second phase signal PH2 for the local word line driver, and the complementary phase driver can provide the local word line driver The driver provides the second complementary phase signal PHN2, so as to meet the driving requirements of the local word line driver and generate local word line signals that meet the requirements.

Figure 5:
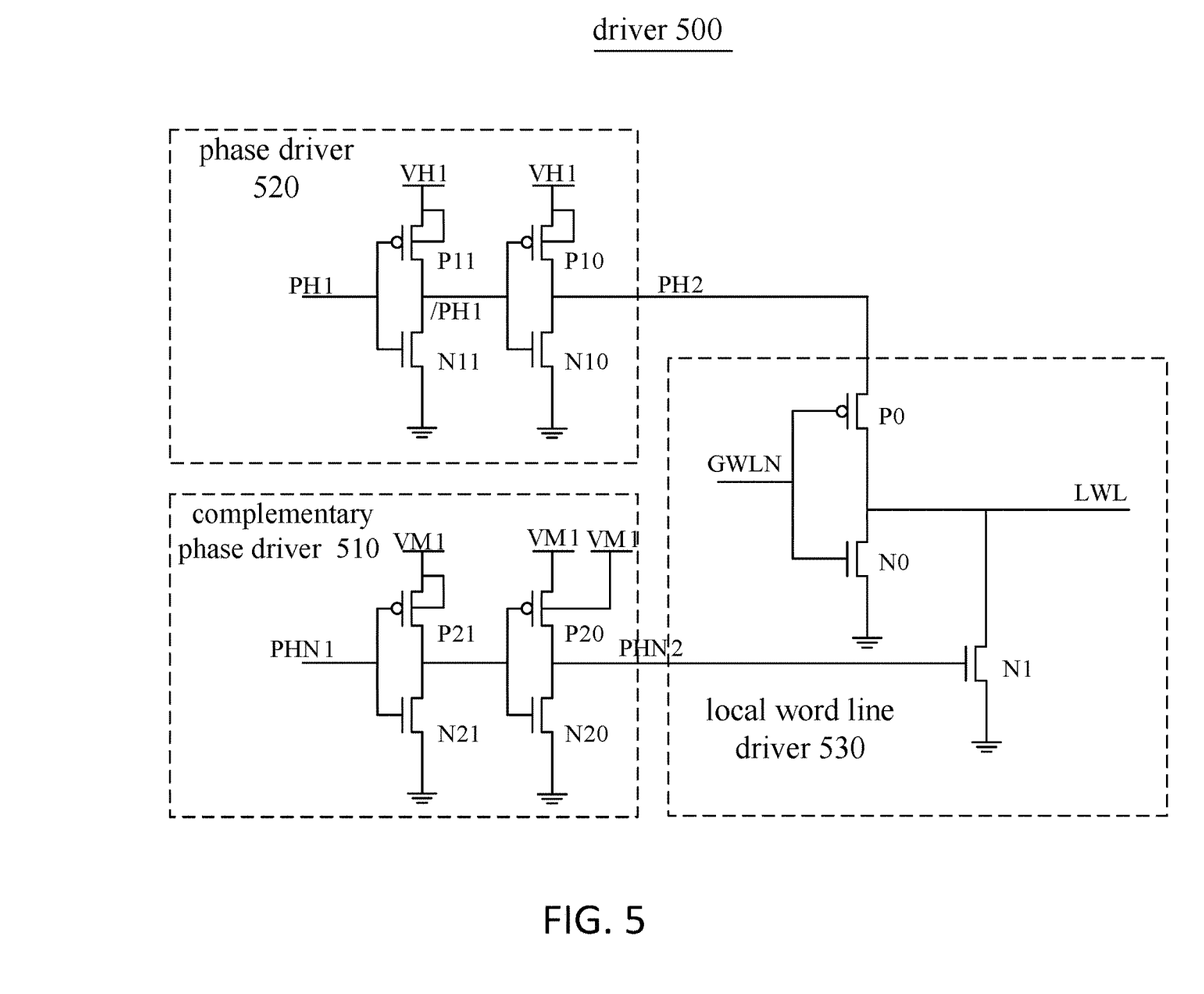
FIG. 5 is a schematic diagram of a driver according to yet another exemplary embodiment of the present disclosure.

FIG. 5 is a schematic diagram of a driver circuit in another exemplary embodiment of the present disclosure.

As shown in FIG. 5, the driver 500 provided by the embodiment of the present disclosure may include a complementary phase driver 510, a phase driver 520 and a local word line driver 530.

For the structure of the complementary phase driver 510, a reference may be made to the complementary phase driver 300 provided in the above embodiment in FIG. 3.

Referring to FIG. 5, the phase driver 520 may include a fifth inverter and a sixth inverter.

The fifth inverter may include a first type of fifth transistor P11 and a second type of firth transistor N11.

The fifth transistor P11 may include a control terminal, a first terminal, a substrate and a second terminal, the control terminal of the fifth transistor P11 may be connected to the first input terminal of the fifth inverter, and may be used for receiving the first phase signal PH1, the first phase signal PH1 and the first complementary phase signal PHN1 are mutually inverse signals. Both the first terminal of the fifth transistor P11 and the substrate of the fifth transistor P11 may be connected to the second input terminal of the fifth inverter, and the second input terminal of the fifth inverter may be connected to the first power supply terminal for using the first voltage signal VH1 provided by the first power supply terminal is received.

The second type transistor N11 may include a control terminal, a first terminal and a second terminal. The control terminal of the transistor N11 may be connected to the control terminal of the fifth transistor P11 and the first input terminal of the fifth inverter, and can also be used for The first phase signal PH1 is received. The first terminal of the transistor N11 may be connected to the second terminal of the fifth transistor P11, and the first terminal of the transistor N11 and the second terminal of the fifth transistor P11 are commonly connected to the output terminal of the fifth inverter for output inverted phase signal /PH1, the inverted phase signal /PH1 and the first phase signal PH1 are mutually inverted signals. The second terminal of the transistor N11 may be connected to a low potential (the grounding is an example in FIG. 5, but the present disclosure is not limited to this).

The fifth inverter may generate the reverse phase signal /PH1 based on the first phase signal PH1 and the first voltage signal VH1, and output the reverse phase signal /PH1 to the first input terminal of the sixth inverter through the output terminal of the fifth inverter.

Continuing to refer to FIG. 5, the sixth inverter may include a sixth transistor P10 of a first type and a transistor N10 of a second type.

The sixth transistor P10 may include a control terminal, a substrate, a first terminal and a second terminal, the control terminal of the sixth transistor P10 may be connected to the first input terminal of the sixth inverter, and the first input of the sixth inverter The terminal is connected to the output terminal of the fifth inverter. Therefore, the control terminal of the sixth transistor P10 can be used to receive the inverted phase signal /PH1. The first phase signal PH1 and the inverted phase signal /PH1 are inverted signals of each other. The first terminal of the sixth transistor P10 can be connected to the second input terminal of the sixth inverter, and the second input terminal of the sixth inverter can be connected to the first power supply terminal, so it can be used to receive the first power supply The first voltage signal VH1 provided by the terminal. The substrate of the sixth transistor P10 can be connected to the second input terminal of the sixth inverter, that is, it can also be used to receive the first voltage signal VH1.

The transistor N10 may include a control terminal, a first terminal and a second terminal, and the control terminal of the transistor N10 may be connected to the control terminal of the sixth transistor P10, and may also be used for receiving the inverted phase signal /PH1. The first terminal of the transistor N10 may be connected to the second terminal of the sixth transistor P10, and the first terminal of the transistor N10 and the second terminal of the sixth transistor P10 may be commonly connected to the output terminal of the sixth inverter. The second terminal of the transistor N10 may be connected to a low potential (the grounding is an example in FIG. 5, but the present disclosure is not limited to this).

The sixth inverter may generate the second phase signal PH2 based on the inverted phase signal /PH1 and the first voltage signal VH1, and may output the second phase signal PH2 to the local word line driver 530 through the output terminal of the sixth inverter.

In an exemplary embodiment, both the fifth transistor P11 and the sixth transistor P10 may be PMOS transistors, and both the transistor N11 and the transistor N10 may be NMOS transistors, but the present disclosure is not limited thereto.

When both the fifth transistor P11 and the sixth transistor P10 are PMOS transistors, the first terminal of the fifth transistor P11 and the first terminal of the sixth transistor P10 may both be the source of the PMOS transistor, both the control terminal of the fifth transistor P11 and the control terminal of the sixth transistor P10 can be the gate of the PMOS transistor, and both the second terminal of the fifth transistor P11 and the second terminal of the sixth transistor P10 may be the drain of the PMOS transistors.

When the transistor N11 and the transistor N10 are both NMOS transistors, both the first terminal of the transistor N11 and the first terminal of the transistor N10 can be the source of the NMOS transistor, both the control terminal of the transistor N11 and the control terminal of the transistor N10 can be the gate of the NMOS transistors, and both the second terminal of the transistor N11 and the second terminal of the transistor N10 can be the drain of the NMOS transistors.

Continuing referring to FIG. 5, the local word line driver 530 may include a PMOS transistor P0 and an NMOS transistor N0 and an NMOS transistor N1.

The gate of the PMOS transistor P0 and the gate of the NMOS transistor N0 can be connected to each other, and both can be used to receive the complementary global word line signal GWLN, and the source of the PMOS transistor P0 can be connected to the sixth inverter of the phase driver 520. The output terminal can be used for receiving the second phase signal PH2 output from the output terminal of the sixth inverter of the phase driver 520. The drain of the PMOS transistor P0 may be connected to the source of the NMOS transistor N0. The drain of the NMOS transistor N0 may be connected to a low potential (the grounding is an example in the embodiment of FIG. 5, but the present disclosure is not limited to this).

The gate of the NMOS transistor N1 may be connected to the second output terminal of the complementary phase driver 510 to receive the second complementary phase signal PHN2 output from the second output terminal of the complementary phase driver 510. The source of the NMOS transistor N1 may be connected to the drain of the PMOS transistor P0 and the source of the NMOS transistor N0. The drain of the NMOS transistor N1 can be connected to a low potential (the ground is an example in the embodiment of FIG. 5, but the present disclosure is not limited to this).

The local word line driver 530 may generate the local word line signal LWL based on the complementary global word line signal GWLN, the second phase signal PH2, and the second complementary phase signal PHN2, and output the local word line signal LWL through the output terminal of the local word line driver 530, the source of the NMOS transistor N1, the drain of the PMOS transistor P0 and the source of the NMOS transistor N0 are commonly connected to the output of the local word line driver 530.

FIG. 6 is a schematic diagram of a complementary phase driver in yet another exemplary embodiment of the present disclosure.

As shown in FIG. 6, the complementary phase driver 600 provided by the embodiment of the present disclosure may include a first inverter 610 and a second inverter 620.

The first inverter 610 may include a fifth input terminal In5, a sixth input terminal In6 and a fifth output terminal Out5, the fifth input terminal In5 may be used to receive the first complementary phase signal PHN1, the sixth input terminal In6 may be connected to the first power terminal for receiving the first voltage signal VH1 provided by the first power terminal, and the first inverter 610 may be used for receiving the first voltage signal VH1 based on the first complementary phase signal PHN1 and the first voltage signal VH1 generating a second complementary inverted phase signal /PHN1-2, the complementary inverted phase signal may include a second complementary inverted phase signal /PHN1-2, and the fifth output terminal Out5 may be used to output the second complementary inverted phase signal Phase signal /PHN1-2.

The second inverter 620 may include a seventh input terminal In7, an eighth input terminal In8, a ninth input terminal In9 and a sixth output terminal Out6, the seventh input terminal In7 may be connected to the fifth input terminal In5, and the seventh input terminal In7 may be connected to the fifth input terminal In5. For receiving the first complementary phase signal PHN1, the eighth input terminal In8 can be connected to the second power terminal for receiving the second voltage signal VM1 provided by the second power terminal. The voltage value may be smaller than the voltage value of the first voltage signal VH1, the ninth input terminal In9 may be connected to the fifth output terminal Out5, and may be used to receive the second complementary phase inverted signal /PHN1-2, the second inverter 620 may be configured to generate a second complementary phase signal PHN2 based on the first complementary phase signal PHN1, the second complementary inverted phase signal /PHN1-2 and the second voltage signal VM1, the sixth output terminal Out6 may be used to output the second complementary phase signal PHN2.

In an exemplary embodiment, the voltage value of the second voltage signal may be smaller than the voltage value of the first voltage signal by 1-2V, for example, 1.5V, but the present disclosure is not limited thereto.

In the complementary phase driver provided by the embodiment of the present disclosure, the first inverter in the complementary phase driver receives the first voltage signal VH1, the second inverter receives the second voltage signal VM1, and the second voltage signal VM1 is set to be smaller than the first voltage signal VH1. A voltage signal VH1 can thereby provide a second complementary phase signal PHN2.

FIG. 7 is a schematic diagram of a complementary phase driver in yet another exemplary embodiment of the present disclosure.

As shown in FIG. 7, the first inverter included in the complementary phase driver 700 provided by the embodiment of the present disclosure may include: a first transistor P21 of a first type and a second transistor N21 of a second type.

The first transistor P21 of the first type may include a first terminal a1 and a substrate E1, and both the first terminal a1 and the substrate E1 of the first transistor P21 are connected to the first power supply terminal to receive the first power supply terminal. the first voltage signal VH1. The second transistor N21 of the second type is connected to the first transistor P21.

Continuing to refer to FIG. 7, the first transistor P21 of the first type may further include a control terminal C1, a substrate E1 and a second terminal a2, the second terminal a2 of the first transistor P21 may be connected to the fifth output terminal Out5, the first control terminal C1 of the transistor P21 can be connected to the fifth input terminal In5, and can receive the first complementary phase signal PHN1, and the substrate E1 of the first transistor P21 can be connected to the sixth input terminal In6, that is, it can also receive the first voltage signal VH1.

The second transistor N21 of the second type may include a control terminal C2, a first terminal a3 and a second terminal a4, the control terminal C2 of the second transistor N21 may be connected to the fifth input terminal In5, and may be used to receive the first terminal Complementary phase signal PHN1, the first terminal a3 of the second transistor N21 can be connected to the fifth output terminal Out5, and the second terminal a4 of the second transistor N21 can be connected to a low potential (the grounding is an example in the embodiment of FIG. 7, but this is not limited).

In an exemplary embodiment, the first transistor P21 may be a PMOS transistor, and the second transistor N21 may be an NMOS transistor, but the present disclosure is not limited thereto.

When the first transistor P21 is a PMOS transistor, the control terminal C1, the first terminal a1 and the second terminal a2 of the first transistor P21 may be the gate, source and drain of the PMOS transistor, respectively. When the second transistor N21 is an NMOS transistor, the control terminal C2, the first terminal a3 and the second terminal a4 of the second transistor N21 may be the gate, source and drain of the NMOS transistor, respectively.

In the embodiment of FIG. 7, the fifth output terminal Out5 of the first inverter can be used to output the second complementary inverted phase signal /PHN1-2, the second complementary inverted phase signal /PHN1-2 and the first complementary phase signal PHN1 are mutually inverse signals.

Continuing to refer to FIG. 7, the second inverter included in the complementary phase driver 700 provided by the embodiment of the present disclosure may include: a second type third transistor P20 and a second type fourth transistor N20.

The second type third transistor P20 may include a control terminal C3, a first terminal a5 (which can be connected to the eighth input terminal In8), and a second terminal a6 (which can be connected to the sixth output terminal Out6). The control terminal C3 of the third transistor P20 can be connected to the seventh input terminal In7 and the fifth input terminal In5 respectively, and can receive the first complementary phase signal PHN1.

The second type fourth transistor N20 may include a control terminal C4, a first terminal a7 and a second terminal a8, the control terminal C4 of the fourth transistor N20 may be connected to the ninth input terminal In9, and the ninth input terminal In9 is connected to the fifth output terminal Out5 of the first inverter, so the control terminal C4 of the fourth transistor N20 can be used to receive the second complementary inverted phase signal /PHN1-2, and the first terminal a7 of the fourth transistor N20 can be connected to the sixth output terminal Out6, the second terminal a8 of the fourth transistor N20 can be connected to a low potential (the grounding is an example in the embodiment of FIG. 7, but the present disclosure is not limited to this).

In an exemplary embodiment, both the second type third transistor P20 and the second type fourth transistor N20 may be NMOS transistors.

When the third transistor P20 of the second type is an NMOS transistor, the control terminal C3, the first terminal a5 and the second terminal a6 of the third transistor P20 may be the gate, source and drain of the NMOS transistor, respectively. When the fourth transistor N20 of the second type is an NMOS transistor, the control terminal C4, the first terminal a7 and the second terminal a8 of the fourth transistor N20 may be the gate, source and drain of the NMOS transistor, respectively.

In the complementary phase driver provided by the embodiments of the present disclosure, on the one hand, since the first inverter receives the first voltage signal VH1, the third transistor P20 in the second inverter can be set as an NMOS transistor, and the voltage value of the first voltage signal VH1 is higher than that of the second voltage signal VM1, for example, it is 1.5V higher, so the second voltage signal VM1 can be transmitted by an NMOS transistor in the second inverter, so that the leakage path between the substrate to the source of the third transistor P20 can be removed from the second inverter in the complementary phase driver.

Figure 8:
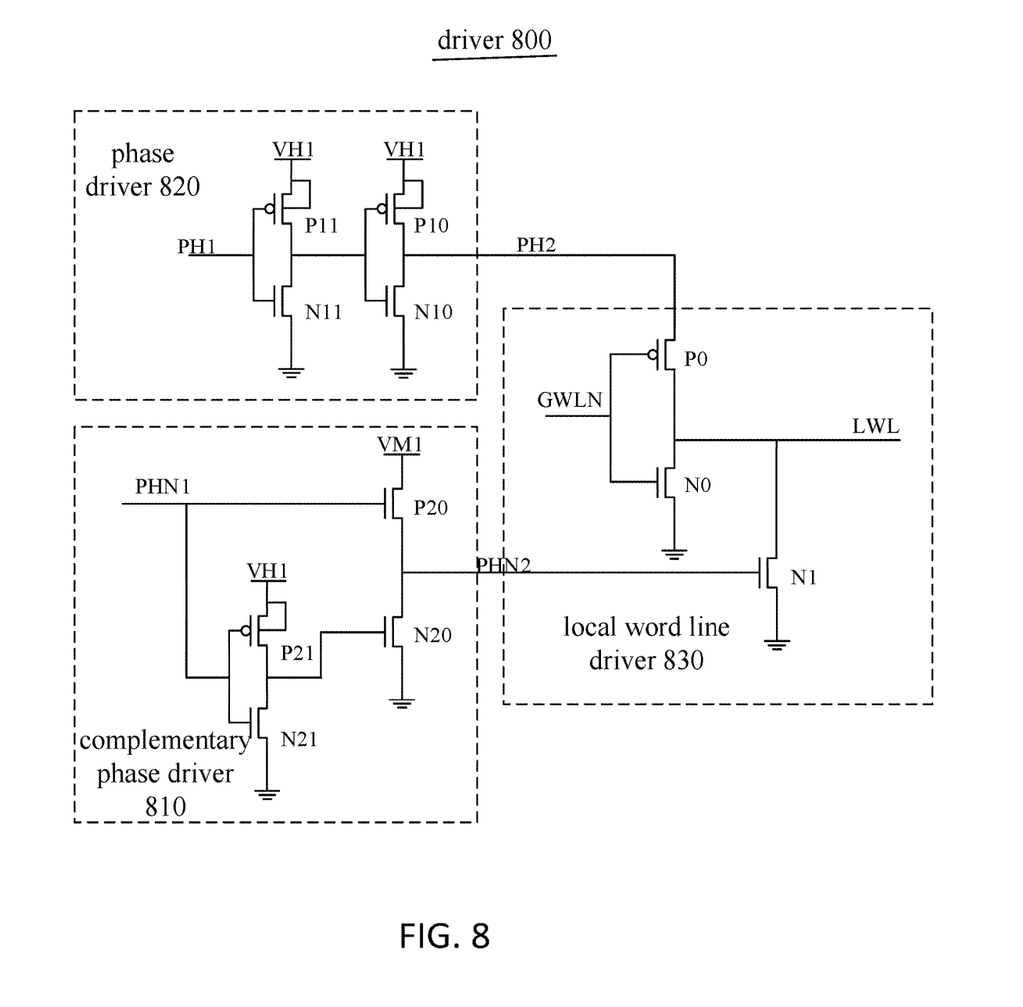
FIG. 8 is a schematic diagram of a driver in yet another exemplary embodiment of the present disclosure.

FIG. 8 is a schematic diagram of a driver in yet another exemplary embodiment of the present disclosure.

As shown in FIG. 8, the driver 800 provided by the embodiment of the present disclosure may include a complementary phase driver 810, a phase driver 820 and a local word line driver 830.

The local word line driver 830 may be connected to the complementary phase driver 810 and the phase driver 820, respectively. The local word line driver 830 can receive the second phase signal PH2 output by the phase driver 820 and the second complementary phase signal PHN2 output by the complementary phase driver 810, respectively, and the local word line driver 830 can be used to generate a signal according to the second phase signal PH2 and the second phase signal PHN2. The second complementary phase signal PHN2 generates the local word line signal LWL For the complementary phase driver 810, reference may be made to the complementary phase driver 700 in the embodiment of FIG. 7 described above. For the phase driver 820 and the local word line driver 830, reference may be made to the phase driver 520 and the local word line driver 530 in the embodiment of FIG. 5, respectively.

In the driver provided by the embodiments of the present disclosure, on the one hand, since the first inverter receives the first voltage signal VH1, the third transistor P20 can be set as an NMOS transistor, and the voltage value of the first voltage signal VH1 is higher than that of the second voltage signal VM1, for example, as high as 1.5V. The NMOS transistor can be used to transmit the second voltage signal VM1, so that the leakage path (path) in the complementary phase driver can be reduced; on the other hand, since the first transistor P21 in the complementary phase driver and the substrate potentials of the fifth transistor P11 and the sixth transistor P10 in the phase driver are both the first voltage signal VH1, therefore, the first transistor P21 in the complementary phase driver and the fifth transistor P11 and the sixth transistor P10 in the phase driver are It can be done in the Nwell of the same voltage domain VH1, that is, the Nwell can be shared, so the layout size of the driver can be reduced.

An embodiment of the present disclosure further provides a memory, which may include: the driver and a storage cell array as shown in any of the foregoing embodiments.

The embodiment of the present disclosure may provide the second phase signal PH2 provided by the above-mentioned phase driver and the second complementary phase signal PHN2 provided by the complementary phase driver to the local word line driver for generating the local word line signal LWL. In a high density semiconductor memory, the memory cell array of the memory is divided into blocks of memory cells. Each block may include local word lines, and local word line drivers may provide corresponding local word line signals for different blocks.

It should be noted that although several modules or units of the apparatus for action performance are mentioned in the above detailed description, this division is not mandatory. Indeed, according to embodiments of the present disclosure, the features and functions of two or more modules or units described above may be embodied in one module or unit. Conversely, the features and functions of one module or unit described above may be further divided into multiple modules or units to be embodied.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

The invention claimed is:
1. A driver, characterized in that, comprising:
a phase driver, wherein the phase driver receives a first voltage signal, and is configured to output a second phase signal based on the first phase signal and a first voltage signal; and
a complementary phase driver, wherein the complementary phase driver comprises:
a first inverter, wherein the first inverter generates a complementary inverted phase signal based on a first complementary phase signal, where the first phase signal and the first complementary phase signal are mutually inverted signals; and
a second inverter, wherein the second inverter receives an output signal of the first inverter and a second voltage signal, wherein a voltage value of the second voltage signal is smaller than a voltage value of the first voltage signal, and wherein the second inverter outputs a second complementary phase signal based on a first complementary inversion phase signal and the second voltage signal.

2. The driver of claim 1, wherein the first inverter comprises:
a first transistor of a first type, comprising a first terminal and a substrate, wherein both the first terminal and the substrate of the first transistor receive the second voltage signal; and
a second transistor of a second type connecting to the first transistor.

3. The driver according to claim 2, wherein the first transistor is a PMOS transistor, wherein the first transistor further comprises a control terminal and a second terminal, wherein the control terminal of the first transistor receives the first complementary phase signal; and
wherein the second transistor is an NMOS transistor, wherein the second transistor comprises a control terminal, a first terminal and a second terminal, wherein the control terminal of the second transistor is connected to the control terminal of the first transistor, and the first terminal of the second transistor is connected to the second terminal of the first transistor, wherein the second terminal of the first transistor outputs the first complementary inversion phase signal, wherein the second terminal of the second transistor is connected to a low potential, and wherein a complementary inversion phase signal comprises the first complementary inversion phase signal.

4. The driver according to claim 1, wherein the second inverter comprises:
a third transistor of a first type, comprising a first terminal and a substrate, and wherein both the first terminal and the substrate of the third transistor receive the second voltage signal; and
a fourth transistor of the second type, connecting to the third transistor.

5. The driver according to claim 4, wherein the third transistor is a PMOS transistor, wherein the third transistor further comprises a control terminal and a second terminal, wherein the control terminal of the third transistor receives the complementary inversion phase signal; and
wherein the fourth transistor is an NMOS transistor, wherein the fourth transistor comprises a control terminal, a first terminal and a second terminal, wherein the control terminal of the fourth transistor is connected to the control terminal of the third transistor, wherein the first terminal of the fourth transistor is connected to the second terminal of the third transistor and outputs the second complementary phase signal, and wherein the second terminal of the fourth transistor is connected to a low potential.

6. The driver according to claim 1, wherein the first inverter comprises:
a first transistor of a first type, wherein the first transistor comprises a first terminal and a substrate, wherein both the first terminal and the substrate of the first transistor receive the first voltage signal; and
a second transistor of a second type, wherein the second transistor is connected to the first transistor.

7. The driver according to claim 6, wherein the first transistor is a PMOS transistor, wherein the first transistor further comprises a control terminal and a second terminal, and wherein the control terminal of the first transistor receives the first complementary phase signal;
wherein the second transistor is an NMOS transistor, wherein the second transistor comprises a control terminal, a first terminal and a second terminal, wherein the control terminal of the second transistor is connected to the control terminal of the first transistor, and wherein the first terminal of the second transistor is connected to the control terminal of the second transistor, wherein the second terminal of the first transistor outputs a second complementary inversion phase signal, wherein a complementary inversion phase signal comprises the second complementary inversion phase signal, and wherein the second terminal of the second transistor is connected to a low potential.

8. The driver according to claim 6, wherein the phase driver comprises:
a fifth transistor of a first type, wherein the fifth transistor comprises a first terminal and a substrate, and wherein both the first terminal and the substrate of the fifth transistor receive the first voltage signal;
a sixth transistor of a first type, wherein the sixth transistor comprises a first terminal and a substrate, wherein both the first terminal and the substrate of the sixth transistor receive the first voltage signal; and
wherein, the first transistor, the fifth transistor and the sixth transistor share an N-well.

9. The driver according to claim 1, wherein the second inverter comprises:
a third transistor of a second type, wherein the third transistor comprises a first terminal, wherein the first terminal of the third transistor receives the second voltage signal; and
a fourth transistor of the second type connecting to the third transistor.

10. The driver according to claim 9, wherein the third transistor is an NMOS transistor, wherein the third transistor further comprises a control terminal and a second terminal, wherein the control terminal of the third transistor receives the first complementary phase signal; and
wherein the fourth transistor is an NMOS transistor, wherein the fourth transistor comprises a control terminal, a first terminal and a second terminal, wherein the control terminal of the fourth transistor receives the complementary inversion phase signal, wherein the first terminal of the fourth transistor is connected to the second terminal of the third transistor and outputs the second complementary phase signal, and wherein the second terminal of the fourth transistor is connected to a low potential.

11. The drive according to claim 1, further comprising:
a local word line driver, wherein the local word line driver is connected to the complementary phase driver and the phase driver respectively, and wherein the local word line driver is configured to generate a local word line signal according to the second phase signal and the second complementary phase signal.

12. The driver according to claim 1, wherein the voltage value of the first voltage signal is in a range of 2.5 to 3.5V, and wherein the voltage value of the second voltage signal is in a range of 1 to 2V.

13. A memory, comprising:
the driver of claim 1; and
an array of memory cells.

* * * * *